US006856264B2

(12) United States Patent
Webb

(10) Patent No.: US 6,856,264 B2
(45) Date of Patent: Feb. 15, 2005

(54) METHOD FOR DECODING REVERSIBLE VARIABLE LENGTH CODE USING LEADING-ZEROS VARIABLE LENGTH DECODING TECHNIQUES

(75) Inventor: Jennifer H. Webb, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/826,946

(22) Filed: Apr. 16, 2004

(65) Prior Publication Data

US 2004/0207546 A1 Oct. 21, 2004

Related U.S. Application Data

(60) Provisional application No. 60/463,263, filed on Apr. 16, 2003.

(51) Int. Cl.[7] ................................................ H03M 7/40
(52) U.S. Cl. ............................ 341/67; 341/50; 341/106
(58) Field of Search ............................ 341/50, 67, 78, 341/79, 89, 106

(56) References Cited

U.S. PATENT DOCUMENTS 6,317,461 B1 * 11/2001 Chujoh et al. ......... 375/240.23
6,501,801 B2 * 12/2002 Chujoh et al. ......... 375/240.23

* cited by examiner

Primary Examiner—Brian Young
Assistant Examiner—John B Nguyen
(74) Attorney, Agent, or Firm—Robert D. Marshall, Jr.; W. James Brady, III; Frederick J. Telecky, Jr.

(57) ABSTRACT

A method for decoding a bitstream of reversible variable length codewords parses the bitstream to extract a next reversible variable length codeword, transcodes each codeword into a pseudo-variable length codeword and decodes pseudo-variable length codeword. The transcoding produces at least some pseudo-variable length codewords suitable for leading zero lookup table decoding in specially adapted hardware. The transcoding may differ for reversible variable length codewords with initial "0" and initial "1". These differing transcodings are decoded with may be decoded with a common lookup table or different sets of lookup tables.

17 Claims, 2 Drawing Sheets

METHOD FOR DECODING REVERSIBLE VARIABLE LENGTH CODE USING LEADING-ZEROS VARIABLE LENGTH DECODING TECHNIQUES

CLAIM OF PRIORITY

This application claims priority under 35 U.S.C. 119(e)(1) from U.S. Provisional Application No. 60/463,263 filed Apr. 16, 2003.

TECHNICAL FIELD OF THE INVENTION

The technical field of this invention is compressed data decoding data encoded with reversible variable length codes.

BACKGROUND OF THE INVENTION

Variable length codes (VLC) are widely used in data compression and particularly in image compression. The set of possible codewords are assigned codes of varying lengths. More frequently used codewords are assigned shorter codes than less frequently used codewords. Exploiting such frequency of use achieves additional data compression because short assigned codes are used more frequently than long assigned codes.

Variable length code decoding is typically implemented using lookup tables. Because the length of the codeword is not known before decoding, the lookup table will include redundant entries corresponding to whatever bits follow the codeword. For instance, if the codeword is 001100 but 7 bits are used for the lookup table index, then either 0011000 or 0011001 correspond to the same codeword. Often the amount of lookup table memory needed can be reduced by narrowing the search based on the number of leading zeroes in the code and using multiple tables. Many devices use hardware accelerators that exploit this leading zero property. Even software only techniques for decoding VLCs typically exploit this property in order to reduce the needed lookup table memory.

Reversible variable length code (RVLC) codewords can be decoded in either the forward or backward direction. This property is believed useful in error recovery, when a special start code or marker follows the RVLC part of the bitstream. A single bit error in the bitstream may result in improper decoding. If the erroneously decoded word has a different length than the correct codeword, then the decoder would be operating on incorrect variable length code thereafter. This error might not be immediately detected. Some later decoding error based on incorrect word boundaries may alert the decoder to existence of the prior error. In that case, some of the uncorrupted data that follows the bit errors may be recovered by decoding the RVLC codewords backwards from the start code that marks the end of the RVLC codewords.

This special structure of reversible variable length codewords means they cannot be decoded efficiently using the techniques generally used for decoding VLCs (variable length codewords). This property is useful for error recovery. Because RVLCs are encoded for error resilience or large free distance, the resulting codetree is sparse but does not include the leading zeros structure of typical VLCs. This makes efficient table lookup difficult. Thus the special structure of RVLC codewords makes the decoding techniques used for regular VLC codewords are less efficient.

For example, the Simple-profile MPEG-4 has the option of using reversible variable length codewords. However, in the RVLC used in the Simple-profile MPEG-4 video standard, all but a few codewords have exactly one leading zero. Using a hardware coprocessor exploiting the leading zero parsing typically used in VLCs, the lookup tables require almost 21 K words. This amount would generally exceed the device buffer limitations. Thus there is a need in the art to reduce the amount of lookup table memory needed to decode RVLCs while using the common leading zeros decode techniques.

SUMMARY OF THE INVENTION

This invention is a method for decoding a bitstream of reversible variable length codewords. The method parses the bitstream to extract a next reversible variable length codeword. The method transcodes each extracted reversible variable length codeword into a pseudo-variable length codeword without complete decoding of the extracted reversible variable length codeword. The resulting pseudo-variable length codeword is then decoded.

The transcoding produces at least some pseudo-variable length codewords suitable for leading zero lookup table decoding. These pseudo-variable length codewords employ leading zero detection for selection of a corresponding lookup table. This invention is especially useful when coupled with hardware adapted for decoding the more common leading zeros variable length codes.

The transcoding generally differs for reversible variable length codewords with initial "0" and initial "1". These differing transcodings may be decoded with different sets of lookup tables. For reversible variable length codewords with initial "0" the transcoding concatenates a first portion corresponding to a position of a third "0", a second portion corresponding to a position of a second "0" and a third portion corresponding to the fixed length code of the reversible variable length code. The number of bits allocated to indication of the position of the second "0" depends upon the position of the third "0". Fewer bits are allocated when the position of the third "0" is smaller.

This invention reduces the table size for an example reversible variable length coding from 20482 words to 330 words for RVLC codewords beginning with 0. This invention does not require modification to the variable length code decoder (VLCD) coprocessor, but works with existing VLCD hardware.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
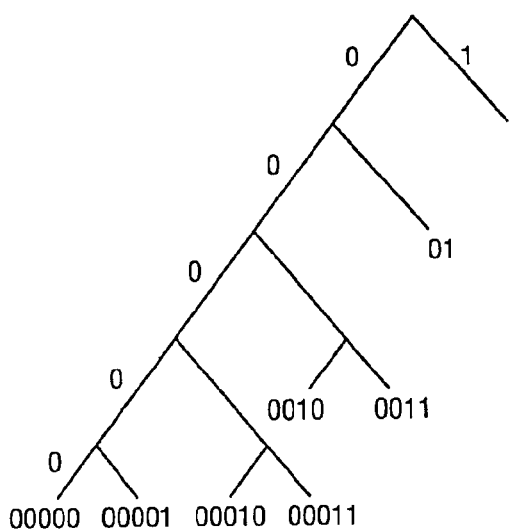
FIG. 1 illustrates a first codetree example showing the structure of a leading zeros variable length code.

Variable length coding is used in JPEG, MPEG-1, MPEG-2 and MPEG-4 to obtain high compression ratios. A codebook can be represented as a binary tree, with the path to each leaf node representing a codeword. FIG. 1 illustrates an example codetree.

In FIG. 1, there are 8 codewords. These five codewords are: 1, 01, 0010, 0011, 00010, 00011, 00001 and 00000. Thus there is one codeword with length 1, one codeword with length 2, two codewords with length 3 and four codewords with length 5. The shortest length is 1 and the longest codeword has length 5. A straight-forward decoding method would examine 5 bits and use these 5 bits as an index into a table with 32 entries. This technique could be very inefficient, for example, for a codebook with 100 codewords with maximum length 16. In that case, the lookup table would require $2^{16}$ entries.

A typical prior art technique uses the number of leading zeros (prefix) to determine an offset to a subtable. This technique uses the remaining suffix bits as an index to the subtable. In the example of FIG. 1, the codewords are divided into prefix and suffix as shown in Table 1.

TABLE 1

| Codeword | Prefix | Suffix |
|---|---|---|
| 1 | — | 1 |
| 01 | 0 | 1 |
| 0010 | 00 | 10 |
| 0011 | 00 | 11 |
| 00010 | 000 | 10 |
| 00011 | 000 | 11 |
| 00001 | 0000 | 1 |
| 00000 | 00000 | — |

A table with 6 offsets for 0 to 5 leading zeros would select a corresponding subtable. These subtables could be concatenated into 8 consecutive entries. This provides a total of 14 entries rather than the original 32. Note that all suffixes begin with 1, but this can be absorbed into the offset. Thus a leading zeros technique is quite useful for many compression standards. Note that a similar leading ones technique could also be applied to a corresponding leading one codetree.

Figure 2:
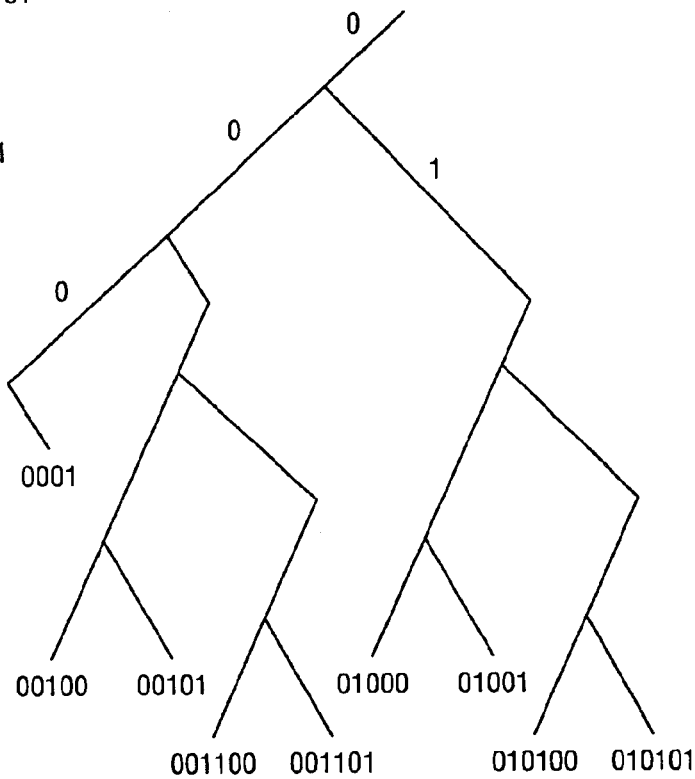
FIG. 2 illustrates a second codetree example showing the structure of a variable length code not having a leading zeros structure.

FIG. 2 illustrates the first 9 zero starting codes in the MPEG-4 RVLC table. The codetree of FIG. 2 does not have the leading-zeros structure. This codebook has one codeword of length 4 (0001), four codewords of length 5 (00100, 00101, 01000 and 01001) and four codewords of length 6 (001100, 001101, 010100 and 010101). The leading zero prefixes and suffixes for these nine codes are shown in Table 2.

TABLE 2

| Codeword | Prefix | Suffix |
|---|---|---|
| 01000 | 0 | 1000 |
| 01001 | 0 | 1001 |
| 010100 | 0 | 10100 |
| 010101 | 0 | 10101 |
| 00100 | 00 | 100 |
| 00101 | 00 | 101 |
| 001100 | 00 | 1100 |
| 001101 | 00 | 1101 |
| 0001 | 000 | 1 |

Using the leading zeros technique requires storing 3 offsets for 1 to 3 leading zeros. The codewords with prefix 0 have a suffix of up to 4 bits after discarding first 1. Thus the subtable for prefix 0 requires 16 entries. The codewords with prefix 00 have a suffix of up to 3 bits after discarding the leading 1. Thus the subtable for prefix 00 requires 8 entries. There is only a single codeword with prefix 000, thus this can be decoded by the initial leading zero technique. Note that the subtrees are sparse and not full. This is in contrast with the example of FIG. 1 where each subtree is full. The larger tables required for this example include space for invalid codewords. For example, 011xx might appear in a bitstream with errors and the decoder should return an error code. Even assuming uncorrupted bitstreams, the leading-zeros tables use space inefficiently when the VLC does not have a leading zeros structure.

This application will describe an example of use of this invention for MPEG-4 RVLC. This technique transcodes the RVLC codetree into another codetree with the preferred leading zeros structure. The transcoded codewords are then decoded as known in the art using a hardware accelerator or a software decoder. This technique is useful for decoding devices which have leading-zeros VLD processing in hardware with limited table space. This transcoding does not require full decoding and re-encoding. Instead, each RVLC codeword is parsed and a pseudo-VLC codeword generated corresponding to a pseudo-codetree. Because the RVLC data stream may be decoded in both a forward direction and a backward direction, this parsing of the codewords is possible without complete decoding. This pseudo-codetree is selected to permit efficient decoding using leading zeros variable length decoding methods.

Reversible variable length codes (RVLC) can be decoded in either the forward or backward direction. These codes are useful when the data may be corrupted by errors. The MPEG-4 video standard includes an option to use RVLC for the DCT data. The RVLC for MPEG-4 is formed by concatenating a variable length code (VLC) with a fixed length code (FLC). The FLC part has 2 bits which includes the sign bit. The VLC part either: starts and ends with a 1 with all (or no) 0 in between; or starts and ends with a 0 with one 0 in between and any remaining bits equal to 1. The longest valid RVLC codeword is 15 bits plus a sign bit. Thus the VLC part can be as long as 14 bits. Depending on the first bit, the VLC part may be as short as 2 bits starting with a 1 (11) or as short as 3 bits starting with a 0 (000).

The codebook is very sparse due to way the RVLC was designed. Not all RVLC codewords with concatenated VLC/FLC structure are used. Codewords are defined for the most common 168 combinations of last, level, and run. An additional 169th codeword serves as an escape coding used for all other cases. The 169 codewords, their decoding for last, run and level for both intra frames and inter frames are shown in Tables 3a, 3b, 3c, 3d, 3e, 3f, 3g and 3h.

This RVLC structure does not lend itself to the type of table lookup strategy that is used for regular VLCs. Normally, 15 bits (without the sign bit) would be read from the bitstream. A single table would require $2^{15}$ of 32K entries. Alternatively the table could be partitioned according to the number of leading zeroes according to the earlier described prior art. For the MPEG-4 RVLC leading zero table partition doesn't help much. Inspection of Tables 3a, 3b, 3c, 3d, 3e, 3f, 3g and 3h show there are 24 codewords beginning with 1, 22 codewords with 2 leading 0s, only 2 codewords with 3 or more leading 0s. All other codewords have exactly one leading 0. The lookup table for codewords with exactly one leading 0 would have to cover indices 01000xxxxxxxxxx through 011111101111101 requiring hex3f7d−hex2000=hex1f7d (8061) entries for the 122 codewords that begin with a single leading 0. Thus, the leading-zeros VLC decoding approach is very inefficient for RVLC decoding.

The sparse nature of RVILC codewords makes table lookups indexed by the codeword itself inefficient. The structure of the codewords can be used to define a pseudo-VLC to access a table that can be more densely packed. For codewords beginning with 0, a pseudo-VLC is formed with 3 fields as follows. First, a number of leading zeros is determined as follows:

Number of leading 0s=14−position of third zero

The pseudo-VLC is a concatenation of these three fields: (1) a number of leading zeros as determined above followed by a "1"; (2) the position of the second zero; and (3) the first bit of the FLC. The number of bits allocated to the second field (position of second zero) depends upon the position of the third zero. Note that the second zero must occur before the third zero. Therefore the number of bits allocated to the second field can be decreased if the position of the third zero is nearer the beginning of the code. Longer RVLC codewords have fewer leading zeros but more bits for the position of the second zero. This keeps the maximum codeword length for the pseudo-VLC below 16 bits.

For codewords beginning with 1, a separate pseudo-VLC using separate tables are formed by simply stripping off the initial 1 bit. Thus:

Number of leading 0s=number of 0s in VLC part

The number of leading zeros in these pseudo-VLC codes is a maximum of 11. The pseudo-VLC is then formed by concatenation of three fields: (1) the number of leading zeros above; (2) "1"; (3) the first bit of the FLC part of the original RVLC codeword. The result is the original RVLC with the leading "1" omitted.

The computation of the number of leading 0s or leading 1s can be done fairly efficiently as a byproduct of parsing. Many devices used for decoding, such as digital signal processors, offer a single-cycle instruction to count the number of leading 0s or 1s. This instruction can be used after stripping off the starting bit. Tables 3a, 3b, 3c, 3d, 3e, 3f, 3g and 3h show the RVLC codewords from Table B-23 of the MPEG-4 video standard. Tables 3a to 3g show the just described pseudo-VLC as the first pseudo-VLC. An asterisk in the pseudo-VLC denotes required use of the separate codebook for RVLC codewords starting with 1. The "s" at the end of the codewords corresponds to the original sign bit.

Decoding the original initial zero RVLC codewords using the known leading zeros technique requires a lookup table with 2048 words. Following the first transcoding described above and shown in Tables 3a, 3b, 3c, 3d, 3e, 3f, 3g and 3h, the decode lookup table for the pseudo-VLC is reduced to 280 words.

TABLE 3a

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 0 | 0 | 0 | 1 | 0 | 0 | 1 | 4 | 110s | * 10s | 100000s | 100100s |
| 1 | 0 | 0 | 2 | 0 | 1 | 1 | 4 | 111s | * 11s | 100001s | 100101s |
| 2 | 0 | 1 | 1 | 0 | 0 | 2 | 5 | 0001s | 000000000001101s | 00000000000011s | 00000000000111s |
| 3 | 0 | 0 | 3 | 0 | 2 | 1 | 5 | 1010s | * 010s | 100010s | 100110s |
| 4 | 1 | 0 | 1 | 1 | 0 | 1 | 5 | 1011s | * 011s | 100011s | 100111s |
| 5 | 0 | 2 | 1 | 0 | 0 | 3 | 6 | 00100s | 00000000001100s | 00000000000100s | 00000000001000s |
| 6 | 0 | 3 | 1 | 0 | 3 | 1 | 6 | 00101s | 00000000001101s | 00000000000101s | 00000000001001s |
| 7 | 0 | 1 | 2 | 0 | 4 | 1 | 6 | 01000s | 00000000001110s | 00000000000110s | 00000000001010s |
| 8 | 0 | 0 | 4 | 0 | 5 | 1 | 6 | 01001s | 00000000001111s | 00000000000111s | 00000000001011s |
| 9 | 1 | 1 | 1 | 1 | 1 | 1 | 6 | 10010s | * 0010s | 100110s | 101000s |
| 10 | 1 | 2 | 1 | 1 | 2 | 1 | 6 | 10011s | * 0011s | 100111s | 101001s |
| 11 | 0 | 4 | 1 | 0 | 1 | 2 | 7 | 001100s | 00000000010100s | 00000000001000s | 00000000001100s |
| 12 | 0 | 5 | 1 | 0 | 6 | 1 | 7 | 001101s | 00000000010101s | 00000000001001s | 00000000001101s |
| 13 | 0 | 0 | 5 | 0 | 7 | 1 | 7 | 010100s | 00000000010110s | 00000000001010s | 00000000001110s |
| 14 | 0 | 0 | 6 | 0 | 8 | 1 | 7 | 010101s | 00000000010111s | 00000000001011s | 00000000001111s |
| 15 | 1 | 3 | 1 | 1 | 3 | 1 | 7 | 011000s | 00000000011000s | 00000000001100s | 00000000010000s |
| 16 | 1 | 4 | 1 | 1 | 4 | 1 | 7 | 011001s | 00000000011001s | 00000000001101s | 00000000010001s |
| 17 | 1 | 5 | 1 | 1 | 5 | 1 | 7 | 100010s | * 00010s | 100110s | 101010s |
| 18 | 1 | 6 | 1 | 1 | 6 | 1 | 7 | 100011s | * 00011s | 100111s | 101011s |
| 19 | 0 | 6 | 1 | 0 | 0 | 4 | 8 | 0011100s | 0000000010100s | 0000000001000s | 0000000001100s |
| 20 | 0 | 7 | 1 | 0 | 2 | 2 | 8 | 0011101s | 0000000010101s | 0000000001001s | 0000000001101s |
| 21 | 0 | 2 | 2 | 0 | 9 | 1 | 8 | 0101100s | 0000000010110s | 0000000001010s | 0000000001110s |
| 22 | 0 | 1 | 3 | 0 | 10 | 1 | 8 | 0101101s | 0000000010111s | 0000000001011s | 0000000001111s |
| 23 | 0 | 0 | 7 | 0 | 11 | 1 | 8 | 0110100s | 0000000011000s | 0000000001100s | 0000000010000s |

TABLE 3b

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 24 | 1 | 7 | 1 | 1 | 7 | 1 | 8 | 0110101s | 0000000011001s | 0000000001101s | 0000000010001s |
| 25 | 1 | 8 | 1 | 1 | 8 | 1 | 8 | 0111000s | 0000000011010s | 0000000001110s | 0000000010010s |
| 26 | 1 | 9 | 1 | 1 | 9 | 1 | 8 | 0111001s | 0000000011011s | 0000000001111s | 0000000010011s |
| 27 | 1 | 10 | 1 | 1 | 10 | 1 | 8 | 1000010s | * 000010s | 101000s | 101100s |
| 28 | 1 | 11 | 1 | 1 | 11 | 1 | 8 | 1000011s | * 000011s | 101001s | 101101s |
| 29 | 0 | 8 | 1 | 0 | 0 | 5 | 9 | 00111100s | 000000010100s | 0000000010000s | 0000000010100s |
| 30 | 0 | 9 | 1 | 0 | 0 | 6 | 9 | 00111101s | 000000010101s | 0000000010001s | 0000000010101s |
| 31 | 0 | 3 | 2 | 0 | 1 | 3 | 9 | 01011100s | 000000010110s | 0000000010010s | 0000000010110s |
| 32 | 0 | 4 | 2 | 0 | 3 | 2 | 9 | 01011101s | 000000010111s | 0000000010011s | 0000000010111s |
| 33 | 0 | 1 | 4 | 0 | 4 | 2 | 9 | 01101100s | 000000011000s | 0000000010100s | 0000000011000s |
| 34 | 0 | 1 | 5 | 0 | 12 | 1 | 9 | 01101101s | 000000011001s | 0000000010101s | 0000000011001s |
| 35 | 0 | 0 | 8 | 0 | 13 | 1 | 9 | 01110100s | 000000011010s | 0000000010110s | 0000000011010s |
| 36 | 0 | 0 | 9 | 0 | 14 | 1 | 9 | 01110101s | 000000011011s | 0000000010111s | 0000000011011s |
| 37 | 1 | 0 | 2 | 1 | 0 | 2 | 9 | 01111000s | 000000011100s | 0000000011000s | 0000000011100s |
| 38 | 1 | 12 | 1 | 1 | 12 | 1 | 9 | 01111001s | 000000011101s | 0000000011001s | 0000000011101s |
| 39 | 1 | 13 | 1 | 1 | 13 | 1 | 9 | 10000010s | * 0000010s | 101010s | 101110s |
| 40 | 1 | 14 | 1 | 1 | 14 | 1 | 9 | 10000011s | * 0000011s | 101011s | 101111s |
| 41 | 0 | 10 | 1 | 0 | 0 | 7 | 10 | 001111100s | 00000010100s | 000000010000s | 000000010100s |
| 42 | 0 | 5 | 2 | 0 | 1 | 4 | 10 | 001111101s | 00000010101s | 000000010001s | 000000010101s |
| 43 | 0 | 2 | 3 | 0 | 2 | 3 | 10 | 010111100s | 00000010110s | 000000010010s | 000000010110s |
| 44 | 0 | 3 | 3 | 0 | 5 | 2 | 10 | 010111101s | 00000010111s | 000000010011s | 000000010111s |
| 45 | 0 | 1 | 6 | 0 | 15 | 1 | 10 | 011011100s | 00000011000s | 000000010100s | 000000011000s |
| 46 | 0 | 0 | 10 | 0 | 16 | 1 | 10 | 011011101s | 00000011001s | 000000010101s | 000000011001s |
| 47 | 0 | 0 | 11 | 0 | 17 | 1 | 10 | 011101100s | 00000011010s | 000000010110s | 000000011010s |

TABLE 3c

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 48 | 1 | 1 | 2 | 1 | 1 | 2 | 10 | 011101101s | 00000011011s | 000000010111s | 000000011011s |
| 49 | 1 | 15 | 1 | 1 | 15 | 1 | 10 | 011110100s | 00000011100s | 000000011000s | 000000011100s |
| 50 | 1 | 16 | 1 | 1 | 16 | 1 | 10 | 011110101s | 00000011101s | 000000011001s | 000000011101s |
| 51 | 1 | 17 | 1 | 1 | 17 | 1 | 10 | 011111000s | 00000011110s | 000000011010s | 000000011110s |
| 52 | 1 | 18 | 1 | 1 | 18 | 1 | 10 | 011111001s | 00000011111s | 000000011011s | 000000011111s |
| 53 | 1 | 19 | 1 | 1 | 19 | 1 | 10 | 100000010s | * 00000010s | 101100s | 110000s |
| 54 | 1 | 20 | 1 | 1 | 20 | 1 | 10 | 100000011s | * 00000011s | 101101s | 110001s |
| 55 | 0 | 11 | 1 | 0 | 0 | 8 | 11 | 0011111100s | 00000100100s | 00000010000s | 00000010100s |
| 56 | 0 | 12 | 1 | 0 | 0 | 9 | 11 | 0011111101s | 00000100101s | 00000010001s | 00000010101s |
| 57 | 0 | 6 | 2 | 0 | 1 | 5 | 11 | 0101111100s | 00000100110s | 00000010010s | 00000010110s |
| 58 | 0 | 7 | 2 | 0 | 3 | 3 | 11 | 0101111101s | 00000100111s | 00000010011s | 00000010111s |
| 59 | 0 | 8 | 2 | 0 | 6 | 2 | 11 | 0110111100s | 00000101000s | 00000010100s | 00000011000s |
| 60 | 0 | 4 | 3 | 0 | 7 | 2 | 11 | 0110111101s | 00000101001s | 00000010101s | 00000011001s |
| 61 | 0 | 2 | 4 | 0 | 8 | 2 | 11 | 0111011100s | 00000101010s | 00000010110s | 00000011010s |
| 62 | 0 | 1 | 7 | 0 | 9 | 2 | 11 | 0111011101s | 00000101011s | 00000010111s | 00000011011s |
| 63 | 0 | 0 | 12 | 0 | 18 | 1 | 11 | 0111101100s | 00000101100s | 00000011000s | 00000011100s |
| 64 | 0 | 0 | 13 | 0 | 19 | 1 | 11 | 0111101101s | 00000101101s | 00000011001s | 00000011101s |
| 65 | 0 | 0 | 14 | 0 | 20 | 1 | 11 | 0111110100s | 00000101110s | 00000011010s | 00000011110s |
| 66 | 1 | 21 | 1 | 1 | 21 | 1 | 11 | 0111110101s | 00000101111s | 00000011011s | 00000011111s |
| 67 | 1 | 22 | 1 | 1 | 22 | 1 | 11 | 0111111000s | 00000110000s | 00000011100s | 00000100000s |
| 68 | 1 | 23 | 1 | 1 | 23 | 1 | 11 | 0111111001s | 00000110001s | 00000011101s | 00000100001s |
| 69 | 1 | 24 | 1 | 1 | 24 | 1 | 11 | 1000000010s | * 000000010s | 101110s | 110010s |
| 70 | 1 | 25 | 1 | 1 | 25 | 1 | 11 | 1000000011s | * 000000011s | 101111s | 110011s |
| 71 | 0 | 13 | 1 | 0 | 0 | 10 | 12 | 00111111100s | 0000100100s | 0000010000s | 0000010100s |

TABLE 3d

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 72 | 0 | 9 | 2 | 0 | 0 | 11 | 12 | 00111111101s | 0000100101s | 0000010001s | 0000010101s |
| 73 | 0 | 5 | 3 | 0 | 1 | 6 | 12 | 01011111100s | 0000100110s | 0000010010s | 0000010110s |
| 74 | 0 | 6 | 3 | 0 | 2 | 4 | 12 | 01011111101s | 0000100111s | 0000010011s | 0000010111s |
| 75 | 0 | 7 | 3 | 0 | 4 | 3 | 12 | 01101111100s | 0000101000s | 0000010100s | 0000011000s |
| 76 | 0 | 3 | 4 | 0 | 5 | 3 | 12 | 01101111101s | 0000101001s | 0000010101s | 0000011001s |
| 77 | 0 | 2 | 5 | 0 | 10 | 2 | 12 | 01110111100s | 0000101010s | 0000010110s | 0000011010s |
| 78 | 0 | 2 | 6 | 0 | 21 | 1 | 12 | 01110111101s | 0000101011s | 0000010111s | 0000011011s |
| 79 | 0 | 1 | 8 | 0 | 22 | 1 | 12 | 01111011100s | 0000101100s | 0000011000s | 0000011100s |

TABLE 3d-continued

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 80 | 0 | 1 | 9 | 0 | 23 | 1 | 12 | 01111011101s | 0000101101s | 0000011001s | 0000011101s |
| 81 | 0 | 0 | 15 | 0 | 24 | 1 | 12 | 01111101100s | 0000101110s | 0000011010s | 0000011110s |
| 82 | 0 | 0 | 16 | 0 | 25 | 1 | 12 | 01111101101s | 0000101111s | 0000011011s | 0000011111s |
| 83 | 0 | 0 | 17 | 0 | 26 | 1 | 12 | 01111110100s | 0000110000s | 0000011100s | 0000100000s |
| 84 | 1 | 0 | 3 | 1 | 0 | 3 | 12 | 01111110101s | 0000110001s | 0000011101s | 0000100001s |
| 85 | 1 | 2 | 2 | 1 | 2 | 2 | 12 | 01111111000s | 0000110010s | 0000011110s | 0000100010s |
| 86 | 1 | 26 | 1 | 1 | 26 | 1 | 12 | 01111111001s | 0000110011s | 0000011111s | 0000100011s |
| 87 | 1 | 27 | 1 | 1 | 27 | 1 | 12 | 10000000010s | * 0000000010s | 110000s | 110100s |
| 88 | 1 | 28 | 1 | 1 | 28 | 1 | 12 | 10000000011s | * 0000000011s | 110001s | 110101s |
| 89 | 0 | 10 | 2 | 0 | 0 | 12 | 13 | 001111111100s | 000100100s | 0000100000s | 0000100100s |
| 90 | 0 | 4 | 4 | 0 | 1 | 7 | 13 | 001111111101s | 000100101s | 0000100001s | 0000100101s |
| 91 | 0 | 5 | 4 | 0 | 2 | 5 | 13 | 010111111100s | 000100110s | 0000100010s | 0000100110s |
| 92 | 0 | 6 | 4 | 0 | 3 | 4 | 13 | 010111111101s | 000100111s | 0000100011s | 0000100111s |
| 93 | 0 | 3 | 5 | 0 | 6 | 3 | 13 | 011011111100s | 000101000s | 0000100100s | 0000101000s |
| 94 | 0 | 4 | 5 | 0 | 7 | 3 | 13 | 011011111101s | 000101001s | 0000100101s | 0000101001s |
| 95 | 0 | 1 | 10 | 0 | 11 | 2 | 13 | 011101111100s | 000101010s | 0000100110s | 0000101010s |

TABLE 3e

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 96 | 0 | 0 | 18 | 0 | 27 | 1 | 13 | 011101111101s | 000101011s | 0000100111s | 0000101011s |
| 97 | 0 | 0 | 19 | 0 | 28 | 1 | 13 | 011110111100s | 000101100s | 0000101000s | 0000101100s |
| 98 | 0 | 0 | 22 | 0 | 29 | 1 | 13 | 011110111101s | 000101101s | 0000101001s | 0000101101s |
| 99 | 1 | 1 | 3 | 1 | 1 | 3 | 13 | 011111011100s | 000101110s | 0000101010s | 0000101110s |
| 100 | 1 | 3 | 2 | 1 | 3 | 2 | 13 | 011111011101s | 000101111s | 0000101011s | 0000101111s |
| 101 | 1 | 4 | 2 | 1 | 4 | 2 | 13 | 011111101100s | 000110000s | 0000101100s | 0000110000s |
| 102 | 1 | 29 | 1 | 1 | 29 | 1 | 13 | 011111101101s | 000110001s | 0000101101s | 0000110001s |
| 103 | 1 | 30 | 1 | 1 | 30 | 1 | 13 | 011111110100s | 000110010s | 0000101110s | 0000110010s |
| 104 | 1 | 31 | 1 | 1 | 31 | 1 | 13 | 011111110101s | 000110011s | 0000101111s | 0000110011s |
| 105 | 1 | 32 | 1 | 1 | 32 | 1 | 13 | 011111111000s | 000110100s | 0000110000s | 0000110100s |
| 106 | 1 | 33 | 1 | 1 | 33 | 1 | 13 | 011111111001s | 000110101s | 0000110001s | 0000110101s |
| 107 | 1 | 34 | 1 | 1 | 34 | 1 | 13 | 100000000010s | * 00000000010s | 110010s | 110110s |
| 108 | 1 | 35 | 1 | 1 | 35 | 1 | 13 | 100000000011s | * 00000000011s | 110011s | 110111s |
| 109 | 0 | 14 | 1 | 0 | 0 | 13 | 14 | 0011111111100s | 00100100s | 000100000s | 000100100s |
| 110 | 0 | 15 | 1 | 0 | 0 | 14 | 14 | 0011111111101s | 00100101s | 000100001s | 000100101s |
| 111 | 0 | 11 | 2 | 0 | 0 | 15 | 14 | 0101111111100s | 00100110s | 000100010s | 000100110s |
| 112 | 0 | 8 | 3 | 0 | 0 | 16 | 14 | 0101111111101s | 00100111s | 000100011s | 000100111s |
| 113 | 0 | 9 | 3 | 0 | 1 | 8 | 14 | 0110111111100s | 00101000s | 000100100s | 000101000s |
| 114 | 0 | 7 | 4 | 0 | 3 | 5 | 14 | 0110111111101s | 00101001s | 000100101s | 000101001s |
| 115 | 0 | 3 | 6 | 0 | 4 | 4 | 14 | 0111011111100s | 00101010s | 000100110s | 000101010s |
| 116 | 0 | 2 | 7 | 0 | 5 | 4 | 14 | 0111011111101s | 00101011s | 000100111s | 000101011s |
| 117 | 0 | 2 | 8 | 0 | 8 | 3 | 14 | 0111101111100s | 00101100s | 000101000s | 000101100s |
| 118 | 0 | 2 | 9 | 0 | 12 | 2 | 14 | 0111101111101s | 00101101s | 000101001s | 000101101s |
| 119 | 0 | 1 | 11 | 0 | 30 | 1 | 14 | 0111110111100s | 00101110s | 000101010s | 000101110s |

TABLE 3f

| B-23 Index | Intra Last | Intra Run | Intra Level | Inter Last | Inter Run | Inter Level | No. Bits | RCLV Codes | First pseudo-VLC Codes | Second pseudo-VLC Codes | Third pseudo-VLC Codes |
|---|---|---|---|---|---|---|---|---|---|---|---|
| 120 | 0 | 0 | 20 | 0 | 31 | 1 | 14 | 0111110111101s | 00101111s | 000101011s | 000101111s |
| 121 | 0 | 0 | 21 | 0 | 32 | 1 | 14 | 0111111011100s | 00110000s | 000101100s | 000110000s |
| 122 | 0 | 0 | 23 | 0 | 33 | 1 | 14 | 0111111011101s | 00110001s | 000101101s | 000110001s |
| 123 | 1 | 0 | 4 | 1 | 0 | 4 | 14 | 0111111101100s | 00110010s | 000101110s | 000110010s |
| 124 | 1 | 5 | 2 | 1 | 5 | 2 | 14 | 0111111101101s | 00110011s | 000101111s | 000110011s |
| 125 | 1 | 6 | 2 | 1 | 6 | 2 | 14 | 0111111110100s | 00110100s | 000110000s | 000110100s |
| 126 | 1 | 7 | 2 | 1 | 7 | 2 | 14 | 0111111110101s | 00110101s | 000110001s | 000110101s |
| 127 | 1 | 8 | 2 | 1 | 8 | 2 | 14 | 0111111111000s | 00110110s | 000110010s | 000110110s |
| 128 | 1 | 9 | 2 | 1 | 9 | 2 | 14 | 0111111111001s | 00110111s | 000110011s | 000110111s |
| 129 | 1 | 36 | 1 | 1 | 36 | 1 | 14 | 1000000000010s | * 000000000010s | 110100s | 111000s |
| 130 | 1 | 37 | 1 | 1 | 37 | 1 | 14 | 1000000000011s | * 000000000011s | 110101s | 111001s |
| 131 | 0 | 16 | 1 | 0 | 0 | 17 | 15 | 00111111111100s | 0100100s | 00100000s | 00100100s |
| 132 | 0 | 17 | 1 | 0 | 0 | 18 | 15 | 00111111111101s | 0100101s | 00100001s | 00100101s |
| 133 | 0 | 18 | 1 | 0 | 1 | 9 | 15 | 01011111111100s | 0100110s | 00100010s | 00100110s |
| 134 | 0 | 8 | 4 | 0 | 1 | 10 | 15 | 01011111111101s | 0100111s | 00100011s | 00100111s |
| 135 | 0 | 5 | 5 | 0 | 2 | 6 | 15 | 01101111111100s | 0101000s | 00100100s | 00101000s |

TABLE 3f-continued

| B-23 Index | Intra Last | Run | Level | Inter Last | Run | Level | No. Bits | RCLV Codes | First pseudo-VLC Codes | Second pseudo-VLC Codes | Third pseudo-VLC Codes |
|---|---|---|---|---|---|---|---|---|---|---|---|
| 136 | 0 | 4 | 6 | 0 | 2 | 7 | 15 | 01101111111101s | 0101001s | 00100101s | 00101001s |
| 137 | 0 | 5 | 6 | 0 | 3 | 6 | 15 | 01110111111100s | 0101010s | 00100110s | 00101010s |
| 138 | 0 | 3 | 7 | 0 | 6 | 4 | 15 | 01110111111101s | 0101011s | 00100111s | 00101011s |
| 139 | 0 | 3 | 8 | 0 | 9 | 3 | 15 | 01111011111100s | 0101100s | 00101000s | 00101100s |
| 140 | 0 | 2 | 10 | 0 | 13 | 2 | 15 | 01111011111101s | 0101101s | 00101001s | 00101101s |
| 141 | 0 | 2 | 11 | 0 | 14 | 2 | 15 | 01111101111100s | 0101110s | 00101010s | 00101110s |
| 142 | 0 | 1 | 12 | 0 | 15 | 2 | 15 | 01111101111101s | 0101111s | 00101011s | 00101111s |
| 143 | 0 | 1 | 13 | 0 | 16 | 2 | 15 | 01111110111100s | 0110000s | 00101100s | 00110000s |

TABLE 3g

| B-23 Index | Intra Last | Run | Level | Inter Last | Run | Level | No. Bits | RCLV Codes | First pseudo-VLC Codes | Second pseudo-VLC Codes | Third pseudo-VLC Codes |
|---|---|---|---|---|---|---|---|---|---|---|---|
| 144 | 0 | 0 | 24 | 0 | 34 | 1 | 15 | 01111110111101s | 0110001s | 00101101s | 00110001s |
| 145 | 0 | 0 | 25 | 0 | 35 | 1 | 15 | 01111111011100s | 0110010s | 00101110s | 00110010s |
| 146 | 0 | 0 | 26 | 0 | 36 | 1 | 15 | 01111111011101s | 0110011s | 00101111s | 00110011s |
| 147 | 1 | 0 | 5 | 1 | 0 | 5 | 15 | 01111111101100s | 0110100s | 00110000s | 00110100s |
| 148 | 1 | 1 | 4 | 1 | 1 | 4 | 15 | 01111111101101s | 0110101s | 00110001s | 00110101s |
| 149 | 1 | 10 | 2 | 1 | 10 | 2 | 15 | 01111111110100s | 0110110s | 00110010s | 00110110s |
| 150 | 1 | 11 | 2 | 1 | 11 | 2 | 15 | 01111111110101s | 0110111s | 00110011s | 00110111s |
| 151 | 1 | 12 | 2 | 1 | 12 | 2 | 15 | 01111111111000s | 0111000s | 00110100s | 00111000s |
| 152 | 1 | 38 | 1 | 1 | 38 | 1 | 15 | 01111111111001s | 0111001s | 00110101s | 00111001s |
| 153 | 1 | 39 | 1 | 1 | 39 | 1 | 15 | 10000000000010s | * 0000000000010s | 110110s | 111010s |
| 154 | 1 | 40 | 1 | 1 | 40 | 1 | 15 | 10000000000011s | * 0000000000011s | 110111s | 111011s |
| 155 | 0 | 0 | 27 | 0 | 0 | 19 | 16 | 001111111111100s | 100100s | 0100000s | 0100100s |
| 156 | 0 | 3 | 9 | 0 | 3 | 7 | 16 | 001111111111101s | 100101s | 0100001s | 0100101s |
| 157 | 0 | 6 | 5 | 0 | 4 | 5 | 16 | 010111111111100s | 100110s | 0100010s | 0100110s |
| 158 | 0 | 7 | 5 | 0 | 7 | 4 | 16 | 010111111111101s | 100111s | 0100011s | 0100111s |
| 159 | 0 | 9 | 4 | 0 | 17 | 2 | 16 | 011011111111100s | 101000s | 0100100s | 0101000s |
| 160 | 0 | 12 | 2 | 0 | 37 | 1 | 16 | 011011111111101s | 101001s | 0100101s | 0101001s |
| 161 | 0 | 19 | 1 | 0 | 38 | 1 | 16 | 011101111111100s | 101010s | 0100110s | 0101010s |
| 162 | 1 | 1 | 5 | 1 | 1 | 5 | 16 | 011101111111101s | 101011s | 0100111s | 0101011s |
| 163 | 1 | 2 | 3 | 1 | 2 | 3 | 16 | 011110111111100s | 101100s | 0101000s | 0101100s |
| 164 | 1 | 13 | 2 | 1 | 13 | 2 | 16 | 011110111111101s | 101101s | 0101001s | 0101101s |
| 165 | 1 | 41 | 1 | 1 | 41 | 1 | 16 | 011111011111100s | 101110s | 0101010s | 0101110s |
| 166 | 1 | 42 | 1 | 1 | 42 | 1 | 16 | 011111011111101s | 101111s | 0101011s | 0101111s |
| 167 | 1 | 43 | 1 | 1 | 43 | 1 | 16 | 011111101111100s | 110000s | 0101100s | 0110000s |

TABLE 3h

| B-23 Index | Intra Last | Run | Level | Inter Last | Run | Level | No. Bits | RCLV Codes | First pseudo-VLC Codes | Second pseudo-VLC Codes | Third pseudo-VLC Codes |
|---|---|---|---|---|---|---|---|---|---|---|---|
| 168 | 1 | 44 | 1 | 1 | 44 | 1 | 16 | 011111101111101s | 110001s | 0101101s | 0110001s |
| 169 | | Escape | | | | | 5 | 0000s | 000000000001100s | 00000000000010s | 00000000000110s |

Variations of this first transcoding are possible. The second pseudo-VLC shown in Tables 3, 3b, 3c, 3d, 3e, 3f, 3g and 3h is formed as follows. For RVLC codewords beginning with 0, a pseudo codeword starting with 0 can be formed with 3 fields as follows:

Number of leading 0s=15−position of third zero

The second pseudo-VLC is formed by concatenating three fields: (1) the number of leading zeros determined above followed by a 1; (2) the position of the second zero; and (2) the first bit of the FLC. The number of bits allocated for expression of the position of the second zero depends on the position of the third zero. For example, if the third zero is the tenth bit, then the second zero must be in the second bit to the ninth bit. Thus 3 bits are allocated for specifying one of these eight possible positions of the second zero. If the third zero is in the third bit, then the second zero must be the second bit. In this case, no bits are allocated to specify the position of the second zero. In this way, longer RVLC codewords have a pseudo-VLCs with fewer leading zeros but more bits for the position of the second zero. This keeps the maximum codeword length for the pseudo-VLC below 16 bits. This maximum was selected because the hardware VLC decoder of the preferred embodiment has a maximum codeword capacity of 16 bits.

In this second transcoding, RVLC codewords beginning with 1 are transcoded as follows. A pseudo codeword starting with 1 is formed with a fixed-length codeword from three fields. The pseudo-VLC consists of the concatenation of: (1) 1; (2) 4 bits specifying the position of the second 1, or equivalently, the number of zeros between the first and second 1; and (3) the first bit of the FLC. In this second pseudo-VLC, RVLC codewords beginning with 0 are transcoded to pseudo-VLC codewords beginning with 0, and RVLC codewords beginning with 1 are transcoded to pseudo-VLC codewords beginning with 1. Because there is no overlap in codewords, a common leading zero table may be used to decode the pseudo-VLC, using leading zero table lookup.

Other variations are feasible. The first two transcodings described above specified the position of the second zero in a zero leading RVLC. The minimum position of the second zero or of the second one is the second bit. This minimum position of the second zero or the second one might be coded as 2, or normalized to 0 or any other number. In the third pseudo-VLC shown in Tables 3a, 3b, 3c, 3d, 3e, 3f, 3g and 3h, this second position is not normalized to 0. This saves computation in forming the pseudo-VLC, but results in adding 2 to that field. This sometimes rolls over into the leading zeros field, but still results in a valid mapping. The third pseudo-VLCs can be constructed from the second pseudo-VLCs by adding binary 100 before appending the sign bit. This still results in a one-to-one mapping between the original RVLCs and the pseudo-VLCs permitting unambiguous decoding.

Figure 3:
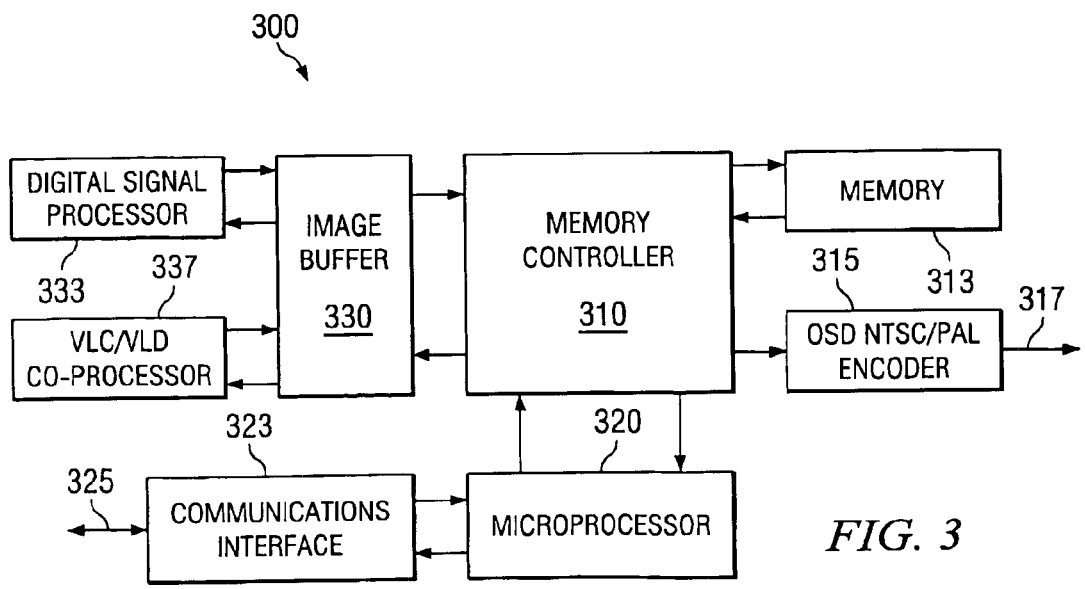
FIG. 3 illustrates the block diagram of an example of an electronic system suitable for implementing this invention.

FIG. 3 illustrates electronic system 300 in which the technique of this application is valuable. Memory controller 310 controls data movement between memory 313, on screen display (OSD) NTSC/PAL encoder 315, microprocessor 320 and image buffer 330. Memory 313 stores the program for both microprocessor 320 and digital signal processor 333 as well as serving an input and output buffer and storing intermediate data. Memory 313 may include both non-volatile memory and volatile memory. On screen display NTSC/PAL encoder 315 is an output of electronic system 300. NTSC and PAL are television standards. NTSC stands for National Television Standards Committee and is used for broadcast television in North American and Japan. PAL stands for Phase Alternating Line and is used for broadcast television in much of Europe. These two television standards are similar. On screen display NTSC/PAL encoder 315 produces a television standard using the NTSC or the PAL standards for output via cable 317. On screen display NTSC/PAL encoder 315 optionally may overlay a text message (on screen display) specified by microprocessor 320 on the television picture.

Microprocessor 320 serves as the main controller for electronic system 300. Microprocessor is bidirectionally coupled to communications line 325 via communications interface. Electronic system 300 may receive data via this connection, transmit data or both.

Image buffer 330 stores at least one frame of image data. Both digital signal processor 333 and variable length code/ variable length decode co-processor 337 have access to this image data. Digital signal processor 333 is preferably a full programmable data processor capable of operation independent of microprocessor 320. Digital signal processor 333 preferably performs image processing on data stored in image buffer 330. Digital signal processor 333 is preferably suitable for computation of discrete cosign transforms (DCT) or inverse discrete cosign transforms (IDCT). Alternately, digital signal processor 333 may use another coprocessor (not shown) to compute DCT/IDCT. VLC/VLD co-processor 337 is a hardware accelerator operable for both variable length coding and variable length decoding. In the context of this invention, VLC/VLD co-processor 337 accepts codewords in the leading zeros format, parses these codes and generates the corresponding DCT codes with the aid of corresponding lookup tables. In the preferred embodiment, these lookup tables are set up by microprocessor 320 or digital signal processor 333 before VLC/VLD co-processor 337 begins operation.

Electronic system 300 would employ this invention as follows. Electronic system 300 receives compressed motion picture data via communications line 325 and communications interface 323. Microprocessor 320, digital signal processor 333 and VLC/VLD co-processor 337 cooperate to decompress this data. Digital signal processor 333 parses and transcodes RVLC data into pseudo-VLC data. VLC/VLD co-processor 337 decodes this pseudo-VLC data in cooperation with appropriate pre-loaded lookup tables. Digital signal processor 333 performs an inverse DCT on this decoded data and assembles image data in image buffer 330 for each frame of the motion picture. Memory controller 310 transfers image data from image buffer 330 to OSD NTSC/ PAL encoder 315 as needed for display generation. OSD NTSC/PAL encoder forms a selected NTSC or PAL television signal and supplies this signal to a television receiver or monitor via cable 317.

Figure 4:
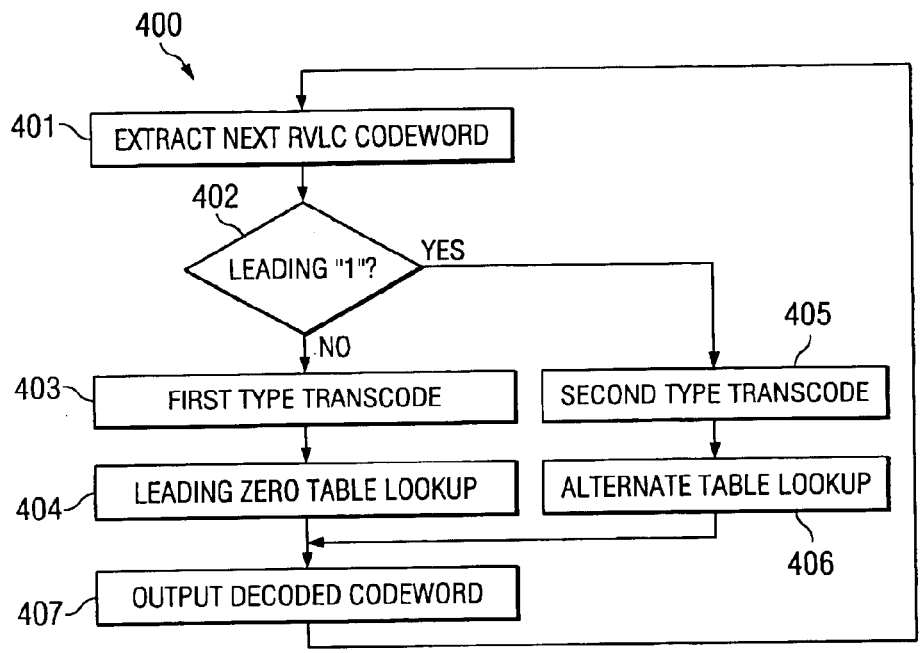
FIG. 4 is a flow chart illustrating how to practice this invention.

FIG. 4 illustrates a flow chart of process 400 this invention. Process 400 is preferably implemented using digital signal processor 333 and VLC/VLD co-processor 337. This invention begins by parsing an input data stream to extract the next RVLC codeword (processing block 401). Process 400 then determines if this extracted RVLC has an initial "1" (decision block 402). If this is not the case, that is, if the RVLC codeword has an initial "0" (No at decision block 402), then process 400 performs a first type transcoding (processing block 403). As described in the several examples above the transcoded data has the leading zeros form suitable for lookup table decoding. This transcoded data is decoded using a leading zero table lookup (processing block 404). In this decoding, the number of leading zeros in each codeword selects one of a set of plural lookup tables. The portion of the codeword following the leading zeros is used an index into the corresponding table. This index selects a memory location storing the corresponding decoded data. In the preferred embodiment this decoding employs hardware such as VLC/VLD co-processor 337. Alternatively, this decoding could be done in software in digital signal processor 333.

If the RVLC codeword has an initial "1" (Yes at decision block 402), then process 400 performs a second type transcoding (processing block 405). Several examples are described above. This result in transcoded data having the leading zeros form suitable for lookup table decoding according to the prior art or another coding type. This transcoded data is decoded using an alternate table lookup (processing block 406).

Regardless of the nature of the decoding, process 400 next outputs the decoded codeword (processing block 407). In the preferred embodiment this decoded codeword is a DCT coefficient for a known portion of an image. Together these DCT coefficients specify image data. Process 400 then returns to extract the next RVLC codeword (processing block). Process 400 repeats for this next RVLC codeword.

FIG. 4 illustrates operating on extracted RVLC codewords one at a time. This is merely for convenience of description. Particularly in case of the second and third pseudo-VLC examples, it is possible to transcode multiple RVLC codewords into image buffer 330 before performing the lookup table decoding using VLC/VLD co-processor 337.

Figure 5:
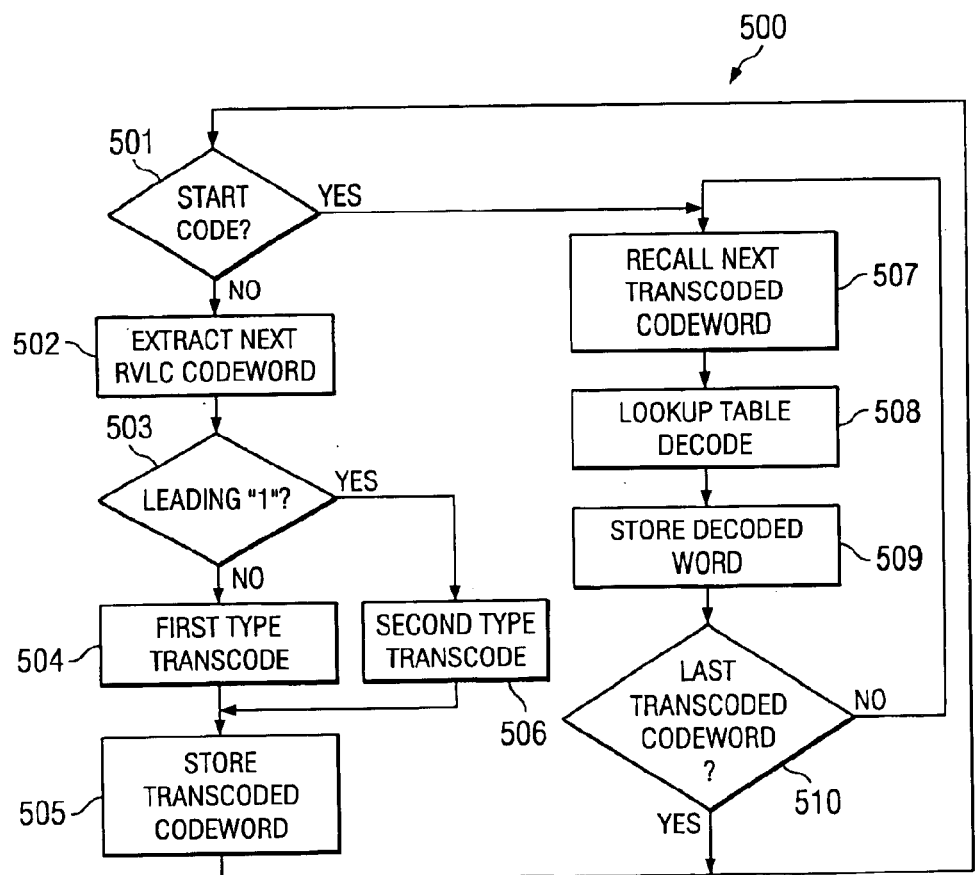
FIG. 5 is a flow chart illustrating an alternative manner of practicing this invention.

FIG. 5 illustrates an alternative, batch oriented manner 500 of practicing this invention. FIG. 5 is similar to FIG. 4 except that RVLC codewords are processed in batches and the transcoding requires only a single set of lookup tables for decoding.

Process 500 begins by determination if the next bits in the bitstream are a start code (decision block 501). This start code marks the boundary between one set of codewords and another. This boundary could be at a block boundary. If the next bits are not a start code (No at decision block 501), then process 500 parses the input data stream to extract the next RVLC codeword (processing block 502). Process 500 then determines if this extracted RVLC has an initial "1" (decision block 503). If this is not the case, that is, if the RVLC codeword has an initial "0" (No at decision block 503), then process 500 performs a first type transcoding (processing block 504). As described in the several examples above the transcoded data has the leading zeros form suitable for lookup table decoding. This transcoded data is stored for later decoding (processing block 505) preferably in image buffer 330.

If the RVLC codeword has an initial "1" (Yes at decision block 503, then process 500 performs a second type transcoding (processing block 506). In this example, these RVLC codewords are transcoded into pseudo-VLC codewords with leading "is" such as the second and third transcoding described above. Regardless of the nature of the decoding, this transcoded data is stored for later decoding (processing block 505) as previously described.

If the next bits are the start code (Yes at decision block 501), then process 500 recall the next transcoded codeword (processing block 507). If this is the first loop after the start code, the next transcoded codeword is the first transcoded codeword. The recalled transcoded codeword is decoded via a lookup table (processing block 508). This process preferably employs VLC/VLC co-processor 337 and an appropriate lookup table. Note that the second and third transcoding can use a single lookup table because RVLC codewords with initial "0" are transcoded to pseudo-VLC codewords with initial "0" and RVLC codewords with initial "1" are transcoded to pseudo-VLC codewords with initial "1". This permits these transcoded codewords to be distinguished. Process 500 then stores the decoded word (processing block 509), preferably in image buffer 330.

Process 500 checks to determine if the last recalled transcoded codeword was the last transcoded codeword in the current batch (decision block 510). If this was not the last transcoded codeword (No at decision block 510), then the next transcoded codeword is recalled (processing block 507). If this was the last transcoded codeword in the current batch (Yes at decision block 510), the process 500 returns to decision block 501 to repeat with the next block of RVLC codewords.

What is claimed is:

1. A method for decoding a bitstream of reversible variable length codewords comprising the steps of:
    parsing the bitstream to extract a next reversible variable length codeword;
    transcoding each extracted reversible variable length codeword into a pseudo-variable length codeword without complete decoding of the extracted reversible variable length codeword; and
    decoding each transcoded pseudo-variable length codeword.

2. The method of claim 1, wherein:
    said step of transcoding produces at least some pseudo-variable length code words suitable for leading zero lookup table decoding; and
    said step of decoding employs leading zero detection for selection of a corresponding lookup table of the pseudo-variable length code words suitable for leading zero lookup table decoding.

3. The method of claim 1, wherein:
    said step of transcoding includes
        detection of whether the extracted reversible variable length codeword has an initial "1" or an initial "0",
        performing a first type transcoding if the extracted reversible variable length codeword has an initial "0",
        performing a second type transcoding different from the first type transcoding if the extracted reversible variable length codeword has an initial "1";
    said step of decoding employs a first set of at least one lookup table for pseudo-variable length codes words resulting from the first type transcoding and a second set of at least one lookup table different from the first set for pseudo-variable length codes words resulting from the second type transcoding.

4. The method of claim 3, wherein:
    the reversible variable length code includes a variable length code portion and a fixed length code portion;
    said first type transcoding includes forming the pseudo-variable length code by concatenating
        a first portion corresponding to a position of a third "0" within the reversible variable length code,
        a second portion corresponding to a position of a second "0" within the reversible variable length code, and
        a third portion corresponding to the fixed length code of the reversible variable length code.

5. The method of claim 4, wherein:
    the first portion corresponding to a position of a third "0" within the reversible variable length code consists of
        a number of leading "0s" equal to the difference of a constant minus the position of the third "0" within the reversible variable length code,
        followed by a "1".

6. The method of claim 5, wherein:
    the constant is 14.

7. The method of claim 5, wherein:
    the constant is 15.

8. The method of claim 4, wherein:
    a number of bits allocated to indication of the position of the second "0" of the second portion of the first type transcoding depends upon the position of the third "0" with fewer bits allocated to indication of the position of the second "0" when the position of the third "0" is smaller.

9. The method of claim 4, wherein:
    the second portion of the first type transcoding is a binary number indicating the position of the second zero within the reversible variable length code.

10. The method of claim 4, wherein:
    the second portion of the first type transcoding is a binary number indicating the position of the second zero within the reversible variable length code normalized wherein a second bit position of the second zero is indicated by the number zero.

11. The method of claim 4, wherein:
    said fixed length code of the reversible variable length code consists of 2 bits; and
    said third portion consists of a first bit of the fixed length code of the reversible variable length code.

12. The method of claim 3, wherein:
    the reversible variable length code includes a variable length code portion and a fixed length code portion;
    said second type transcoding includes forming the pseudo-variable length code by concatenating a first portion including a number of leading "0s" corresponding to a number of "0" in the variable length code portion of the reversible variable length code followed by "1", and a second portion corresponding to the fixed length code.

13. The method of claim 12, wherein:

said fixed length code of the reversible variable length code consists of 2 bits; and said second portion consists of a first bit of the fixed length code of the reversible variable length code.

14. The method of claim 3, wherein:

the reversible variable length code includes a variable length code portion and a fixed length code portion;

said second type transcoding includes forming the pseudo-variable length code by concatenating
a first portion consisting of a "1",
a second portion consisting of a fixed number of bits indicating a position of a second "1" in the variable length portion of the reversible variable length code, and
a third portion corresponding to the fixed length code.

15. The method of claim 14, wherein:

said fixed number of bits of the second portion consists of 4 bits.

16. The method of claim 14, wherein:

said fixed length code of the reversible variable length code consists of 2 bits; and said second portion consists of a first bit of the fixed length code of the reversible variable length code.

17. The method of claim 1, wherein:

said step of transcoding each extracted reversible variable length codeword into a pseudo-variable length codeword includes transcoding a batch of a plurality of extracted reversible variable length codes and storing the pseudo-variable length codewords before decoding a first of the extracted reversible variable length codewords; and said step of decoding each transcoded pseudo-variable length codeword includes recalling a batch of stored pseudo-variable length codewords and decoding the batch of recalled pseudo-variable length codewords before transcoding a next reversible variable length codeword.

* * * * *